(12) United States Patent
Kim et al.

(10) Patent No.: US 9,442,515 B2
(45) Date of Patent: Sep. 13, 2016

(54) CASE INCLUDING METAL FOR AN ELECTRONIC DEVICE AND ELECTRONIC DEVICE HAVING THE SAME

(71) Applicant: Samsung Electronics Co., Ltd., Gyeonggi-do (KR)

(72) Inventors: Yeonwoo Kim, Seoul (KR); Hosaeng Kim, Gyeonggi-do (KR); Hoon Park, Seoul (KR); Jinwoo Jung, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/528,564

(22) Filed: Oct. 30, 2014

(65) Prior Publication Data

US 2015/0116933 A1 Apr. 30, 2015

(30) Foreign Application Priority Data

Oct. 30, 2013 (KR) .................. 10-2013-0130179

(51) Int. Cl.
- *G06F 1/16* (2006.01)
- *H01Q 1/24* (2006.01)
- *H01Q 1/44* (2006.01)
- *H04M 1/02* (2006.01)

(52) U.S. Cl.
CPC ............. *G06F 1/1613* (2013.01); *G06F 1/169* (2013.01); *G06F 1/1656* (2013.01); *G06F 1/1698* (2013.01); *H01Q 1/243* (2013.01); *H01Q 1/44* (2013.01); *H04M 1/0202* (2013.01)

(58) Field of Classification Search
CPC .. G06F 1/1626; G06F 1/1601; G06F 1/1637; G06F 1/1623; G06F 1/1613; G06F 1/1656; G06F 1/169; G06F 1/1698; G06F 1/1632; G06F 2200/1632; G06F 2200/1633; H05K 5/04; H05K 5/0004; H05K 7/20418; H05K 9/0007; H01Q 1/243; H01Q 1/44; H04M 1/0202

USPC ............ 361/679.01, 679.02, 679.21, 679.26, 361/679.27, 679.55, 679.56, 679.3; 455/575.1–575.4

See application file for complete search history.

(56) References Cited

U.S. PATENT DOCUMENTS

| | | | | |
|---|---|---|---|---|
| 2007/0216583 A1* | 9/2007 | Hou | .................. | B29C 45/14811 343/702 |
| 2013/0257662 A1* | 10/2013 | Eom | ...................... | H01Q 1/243 343/702 |

FOREIGN PATENT DOCUMENTS

| | | |
|---|---|---|
| KR | 1020110083966 | 7/2011 |
| KR | 1020120138019 | 12/2012 |

* cited by examiner

*Primary Examiner* — Anthony Haughton
*Assistant Examiner* — Ingrid Wright
(74) *Attorney, Agent, or Firm* — The Farrell Law Firm, P.C.

(57) ABSTRACT

A case including metal for an electronic device and an electronic device having the same are provided. The electronic device includes a case comprising an injection-molded part including a plurality of holes, and a metal part formed under the injection-molded part, and the metal part being partially exposed through the plurality of holes. The metal part is divided into a plurality of parts via a cut portion formed in a portion of the metal part not exposed through the plurality of holes, and at least one of the plurality of the divided metal parts is utilized as a component element related to a specific function of the electronic device.

11 Claims, 8 Drawing Sheets

CASE INCLUDING METAL FOR AN ELECTRONIC DEVICE AND ELECTRONIC DEVICE HAVING THE SAME

PRIORITY

This application claims priority under 35 U.S.C. §119(a) to Korean Patent Application No. 10-2013-0130179, which was filed in the Korean Intellectual Property Office on Oct. 30, 2013, the content of which is incorporated herein by reference.

BACKGROUND OF THE INVENTION

1. Field of the invention

The present invention relates generally to a case including metal for an electronic device and an electronic device having the same.

2. Description of the Prior Art

With the development of information communication technology and semiconductor technology, the use of electronic devices is rapidly increasing. The electronic devices developed recently are not limited to their traditional unique areas but are combined with various terminals. For example, a mobile communication terminal provides various functions such as a TV function (for example, mobile broadcasting such as Digital Multimedia Broadcasting (DMB) or Digital Video Broadcasting (DVB)), a music reproduction function (for example, MPEG Audio Layer-3 (MP3)), a picture or video photographing function, an Internet connection function, and a radio reception function, in addition to communication functions such as voice communication and the transmission/reception of messages.

The general trend is for electronic devices to be slim, and as such the slim electronic devices have a metal case for improved strength or for design. Further, the electronic devices include at least one antenna to provide various wireless communication functions.

However, when a metal case surrounds an antenna, performance of the antenna is often significantly decreased. Accordingly, in conventional electronic devices, it is common that metal at a portion where the antenna is located is removed from the metal case.

Further, in conventional electronic devices, the metal case is often separated (cut), and the separated area is utilized as a portion for the antenna. Consequently the cut portion of the electronic device is exposed to the outside, and as such, the performance of the antenna is often badly influenced by the human body. The location, size, and shape of the cut portion may be different according to a frequency band supported by electronic devices.

SUMMARY OF THE INVENTION

The present invention has been made in an effort to solve at least one of the above-described problems and/or disadvantages, and to provide at least the advantages described below.

Accordingly, an aspect of the present invention is to provide a case for an electronic device including metal, wherein only an uncut portion of the metal is exposed to the outside and a cut portion of the metal is not exposed to the outside, and an electronic device having the same.

Another aspect of the present invention is to provide a case for an electronic device including metal, wherein a cut portion of metal is not exposed to the outside, thereby reducing an influence of a human body on the metal, and an electronic device having the same.

Another aspect of the present invention is to provide a case for an electronic device including metal, wherein a cut portion of metal is not exposed to the outside, thereby reducing an influence of the cut portion on the design, and an electronic device having the same.

Another aspect of the present invention is to provide a case for an electronic device including a divided metal, part that can be utilized as a configuration of an antenna, a function key, a wireless charger or a grip sensor, and an electronic device having the same.

In accordance with an aspect of the present invention, an electronic device is provided, which includes a case including an injection-molded part including a plurality of holes, and a metal part formed under the injection-molded part, and the metal part being partially exposed through the plurality of holes, wherein the metal part is divided into a plurality of parts via a cut portion formed in a portion of the metal part not exposed through the plurality of holes, and wherein at least one of the plurality of the divided metal parts is utilized as a component element related to a specific function of the electronic device.

In accordance with another aspect of the present invention, a case of an electronic device is provided, which includes an injection-molded part including a plurality of holes; and a metal part located under the injection-molded part and partially exposed through the plurality of holes.

BRIEF DESCRIPTION OF THE DRAWINGS

The above and other aspects, features, and advantages of certain embodiments of the present invention will be more apparent from the following detailed description, taken in conjunction with the accompanying drawings, in which.

DETAILED DESCRIPTION OF EMBODIMENTS OF THE PRESENT INVENTION

Figure 1:
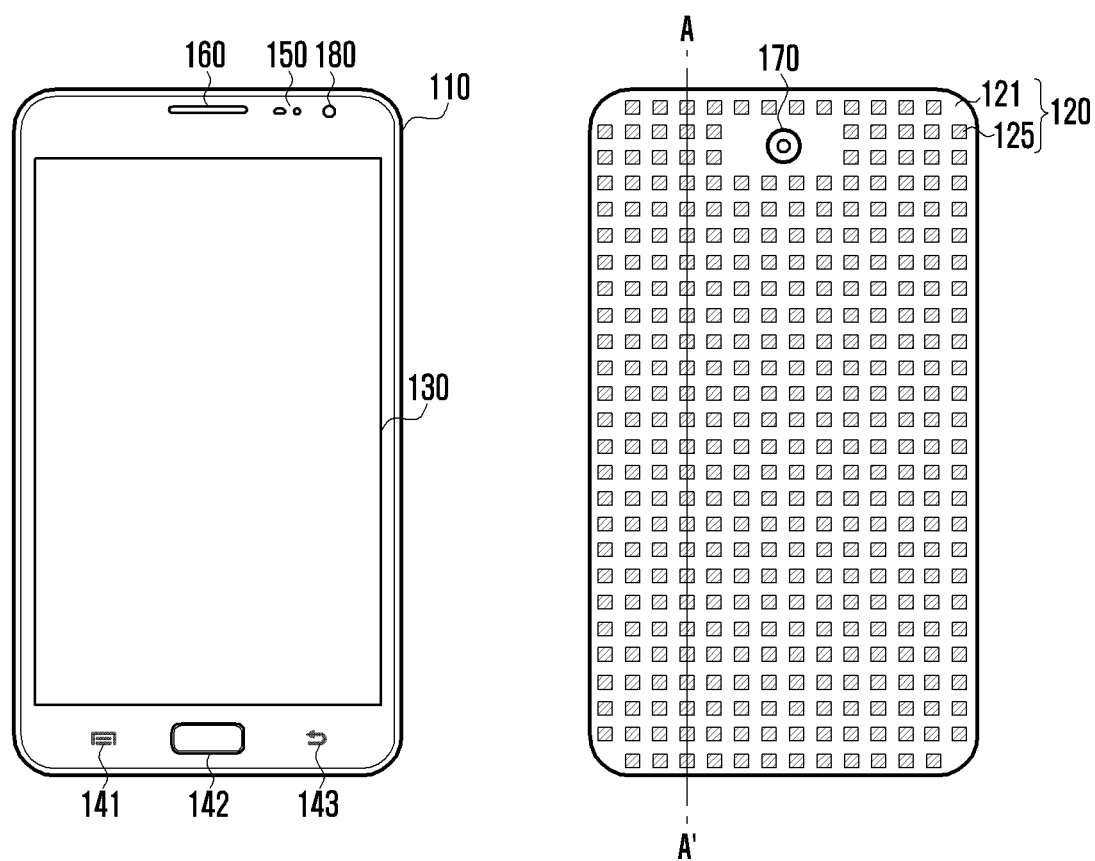
FIG. 1 illustrates an electronic device according to an embodiment of the present invention.

Hereinafter, various embodiments of the invention will be described in detail with reference to the accompanying drawings. It should be noted that the same elements will be designated by the same reference numerals although they are shown in different drawings. Further, detailed descriptions related to well-known functions or configurations capable of making subject matters of the present invention unnecessarily obscure will be omitted.

In the following description, it should be noted that only portions required for comprehension of operations according to the embodiments of the present invention will be described and descriptions of other portions will be omitted not to make subject matters of the present invention obscure. Also, in the accompanying drawings, some elements are exaggerated, omitted, or schematically illustrated, and the size of each element does not entirely reflect an actual size.

The various embodiments of the present invention described herein and in the drawings have been presented to easily explain contents of the present invention and help comprehension of the present invention, and do not limit the scope of the present invention. Therefore, it should be construed that all modifications or modified forms drawn by the technical idea of the present invention in addition to the embodiments disclosed herein are included in the scope of the present invention.

An electronic device according to an embodiment of the present invention may include a mobile communication device, a Personal Digital Assistant (PDA), a smartphone, a tablet Personal Computer (PC), a Portable Multimedia Player (PMP), a wearable device, and the like.

Figure 2A:
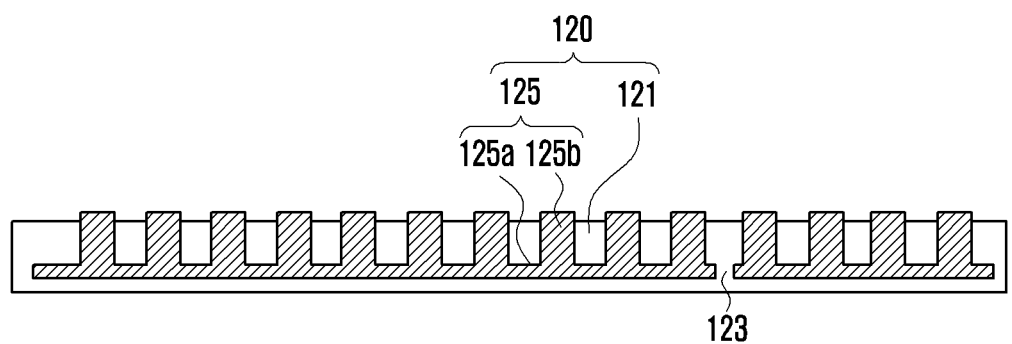
FIGS. 2A and 2B are sectional views illustrating a case of an electronic device according to the embodiment of the present invention, the sectional views being taken along line A-A' of FIG. 1.
Figure 2B:
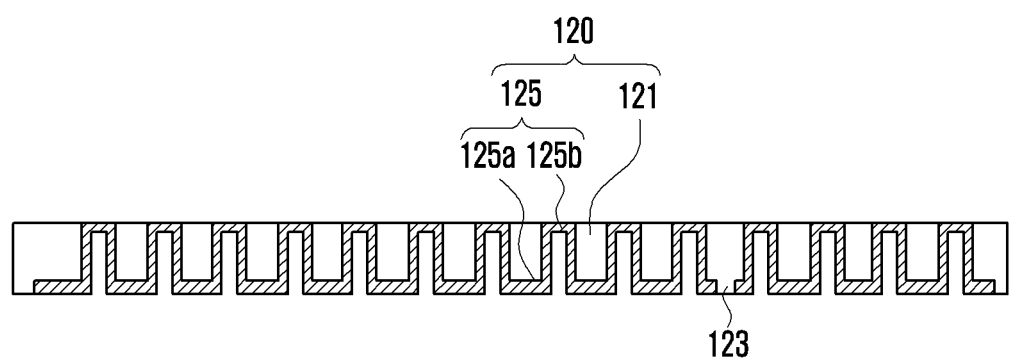

FIG. 1 illustrates an electronic device according to an embodiment of the present invention. FIGS. 2A and 2B are sectional views illustrating a case of an electronic device according to an embodiment of the present invention, the sectional views being taken along line A-A' of FIG. 1.

Referring to FIGS. 1 and 2B, an electronic device 100 includes a display unit 130 located on a front surface thereof, an illumination sensor 150, a speaker 160, and a front camera 180 located at a upper end of the display unit 130, and a plurality of keys 141, 142, and 143 located at lower end of the display unit 130. A rear camera 170 is located on a rear surface of the electronic device 100.

The electronic device 100 includes a front case portion 110 and a rear case portion 120. The rear case portion 120 includes an injection-molding part 121 and a metal part 125. The injection-molding part 121 may be formed of a non-metallic plastic.

The metal part 125 is located under the injection-molding part 121, and is partially exposed to the outside through a hole of the injection-molding part 121. That is, the metal part 125 includes an area 125a (hereinafter, referred to as a plate portion) which is not exposed to the outside, and an area 125b (hereinafter, referred to as a protruding portion) which is exposed to the outside. As illustrated in FIG. 2A, the metal part 125 is formed in a convexo-concave pattern. As illustrated in FIG. 2B, the metal part 125 is formed in a meandering pattern. Further, the metal part 125 may be formed in a combination type of a convexo-concave type and a meandering type.

The metal part 125 is divided into a plurality of parts or has at least one slit. As indicated by reference numeral 123 of FIGS. 2A and 2B, a portion of the plate portion 125a of the metal part 125 which is not exposed to the outside, is cut (herein after, referred to as "cut portion 123"). Although not illustrated the metal part 125 may be divided into a plurality of parts, wherein at least one of the plurality of divided metal parts has at least one slit.

At least one of the plurality of divided metal parts and/or the slit may be utilized as a component element related to a specific function of the electronic device 100. For example, at least one of the divided metal parts may be utilized as an antenna. The antenna may include a mobile communication antenna for mobile communication such as 2G, 3G, or 4G, a Bluetooth antenna for Bluetooth communication, a Near Field Communication (NFC) antenna, a wireless LAN antenna, a wireless charging antenna, a diversity antenna, and a grip sensor antenna. The antenna may be a coupling antenna, a (Planar) Inverted-F Antenna ((P)IFA), a loop antenna, a patch antenna, etc.

Further, the divided metal parts may be utilized as function keys (for example, a power key and volume keys). When being utilized as function keys, the divided metal parts are connected to a sensor for detecting a touch.

In addition, the divided metal parts (or slits) may be utilized as a configuration (for example, a coil or a pattern) for NFC or wireless charging.

The electronic device 100 illustrated in FIG. 1 is a simple example, the embodiments of the present invention are not limited thereto. For example, although a bar type electronic device is illustrated in FIG. 1, the embodiments of the present invention may be applied to a folder type electronic device or a slide type electronic device. Further, FIG. 1 illustrates the present invention being applied to the rear case portion 120 of the electronic device 100, it may be applied to a front case portion 110 and/or a side case portion of the electronic device 100.

Figure 3:
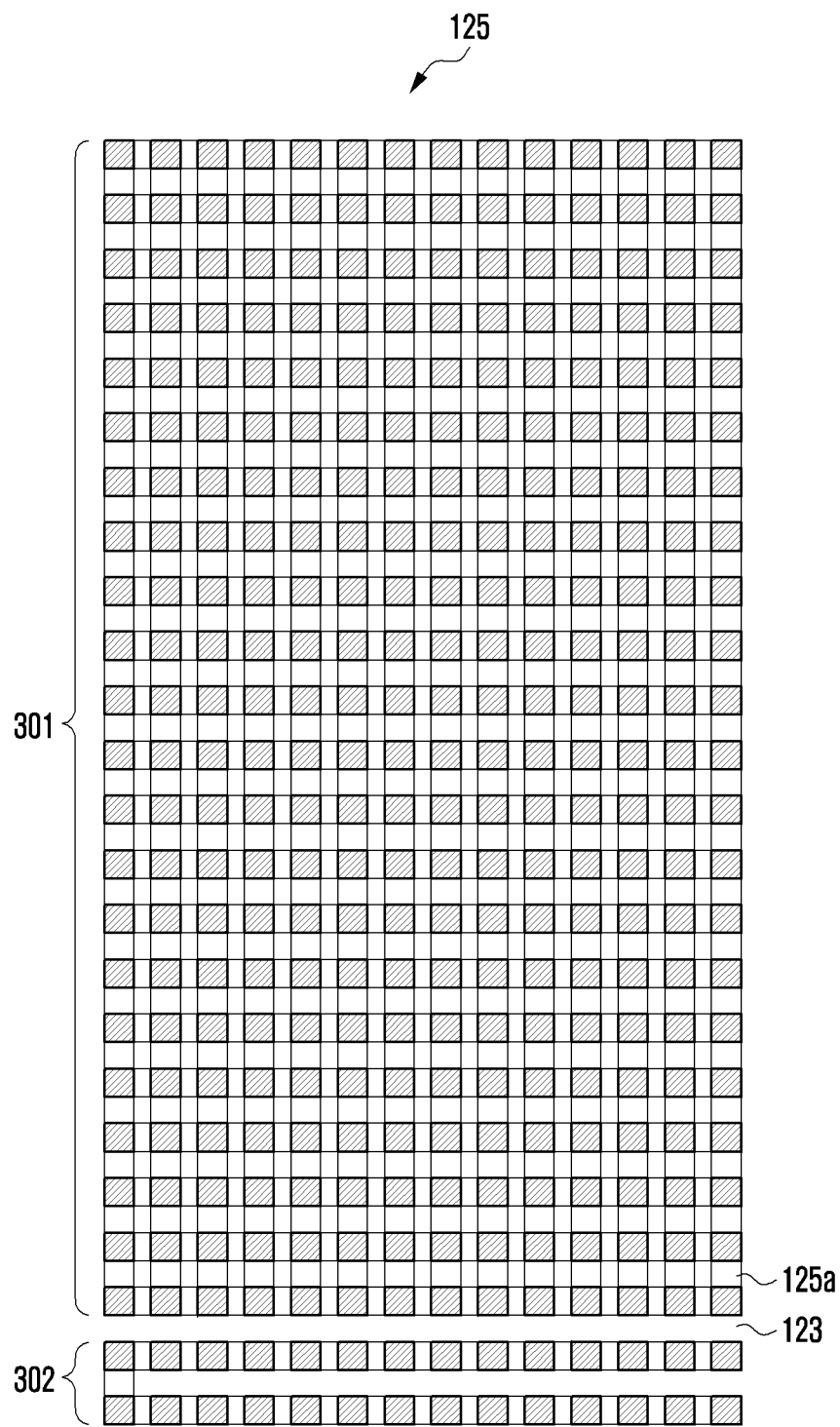
FIGS. 3 and 4 illustrate a method of forming an antenna using a metal part of a case according to an embodiment of the present invention.
Figure 4:
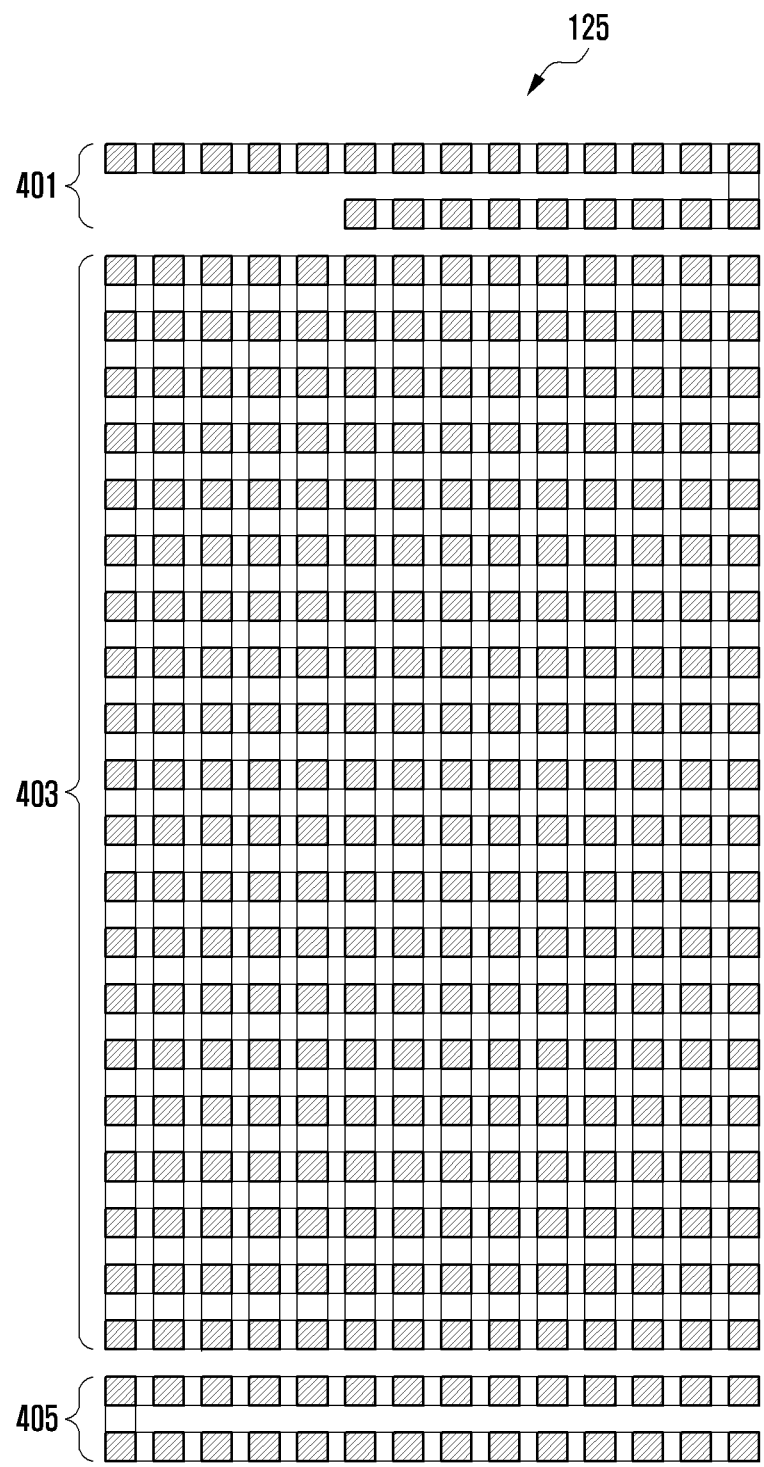

FIGS. 3 and 4 illustrate a method of forming an antenna using a metal part of a case according to an embodiment of the present invention.

In FIGS. 3 and 4, a portion having a shadow refers to a protruding portion and a portion having no shadow refers to a plate portion.

Referring to FIG. 3, the metal part 125 may be classified into a first area 301 and a second area 302 as the plate portion 125a is partially removed at cut portion 123. For example, the first area 301 is an area in which a strength and/or a design of the case is considered. Further, the first area 301 may be electrically connected to a ground area of a Printed Circuit Board (PCB) of the electronic device 100 and may be utilized to expand the ground.

The second area 302 may be an antenna of the electronic device 100. The second area 302 performing an antenna function may be electrically connected to a power feeding unit of the printed circuit board. The second area 302 may be electrically connected to the power feeding unit and the ground of the printed circuit board. Although FIG. 3 illustrates that the second area 302 has a stapler shape, it is not limited thereto. For example, the second area 302 may have a different shape and/or size according to a frequency band supported by the electronic device.

Referring to FIG. 4, the metal part 125 is divided into a first area 401, a second area 403, and a third area 405. The first area 401 and the third area 405 may be utilized as antennas. Similarly, when the electronic device 100 requires a plurality of antennas, the metal part 125 may be divided into more than 3 parts.

In the above-described embodiments of the present invention, the metal part 125 is divided into a plurality of parts by partially removing the plate portion 125a, which is not exposed to the outside. Accordingly, the cut portions 123 of the metal part 125 are not exposed to the outside. Accordingly, when the electronic device 100 supports different frequency band using different antennas, an external design of the electronic device 100 may be the same. Further, reduction of antenna performance due to a human body can be prevented.

Figure 5:
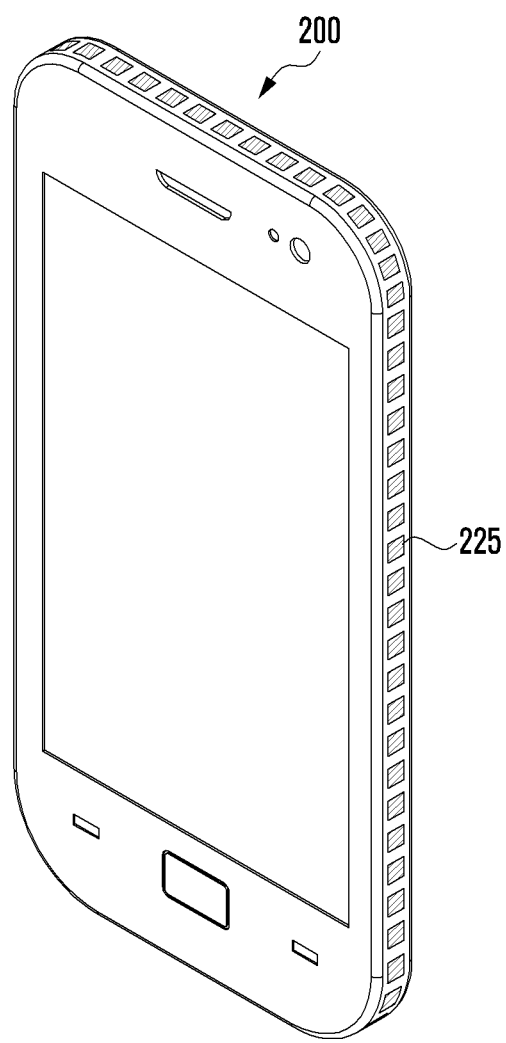
FIG. 5 illustrates an electronic device according to an embodiment of the present invention.
Figure 6:
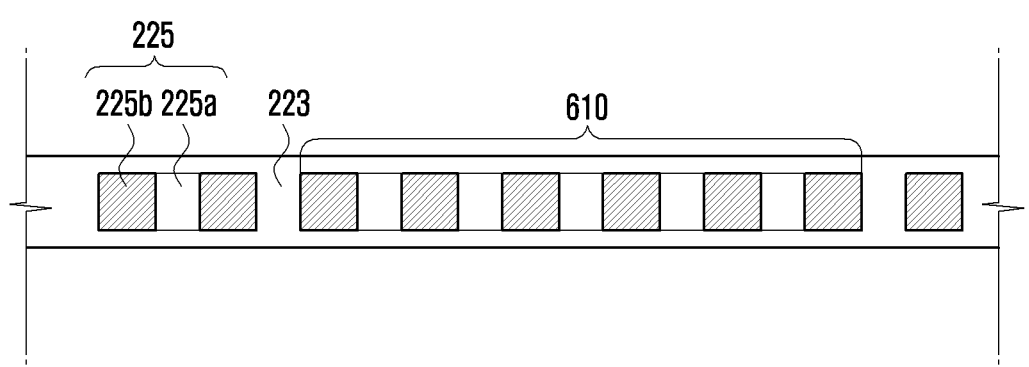
FIG. 6 illustrates a method of forming an antenna of an electronic device according to an embodiment of the present invention.

FIG. 5 illustrates an electronic device according to an embodiment of the present invention. FIG. 6 illustrates a method of forming an antenna of an electronic device according to an embodiment of the present invention.

Referring to FIGS. 5 and 6, the electronic device 200 includes a metal part 225 on a side surface of a case. The metal part 225 is exposed to the outside only partially. For example, the metal part 225 includes a plate portion 225a which is not exposed to the outside and a protruding portion 225b, which is exposed to the outside. This structure has already been described above, and, therefore, a repetitive description is omitted here.

As illustrated in FIG. 6, the metal part 225 is divided into a plurality of parts by partially removing the plate portion 225a at a cut portion 223. A specific metal part portion 610 of the divided metal part portions may be utilized as a component element related to a specific function of the electronic device 200. For example, the divided specific metal part portion 610 is utilized as an antenna, a function key (for example, a volume key or a power key), or a grip sensor. Here, the grip sensor recognizes the gripping of an antenna portion by the user. When the gripping of an antenna portion by the user is recognized by the grip sensor, the electronic device 200 controls to use an antenna at another location so that the antenna and the grip sensor can be commonly used.

Figure 7:
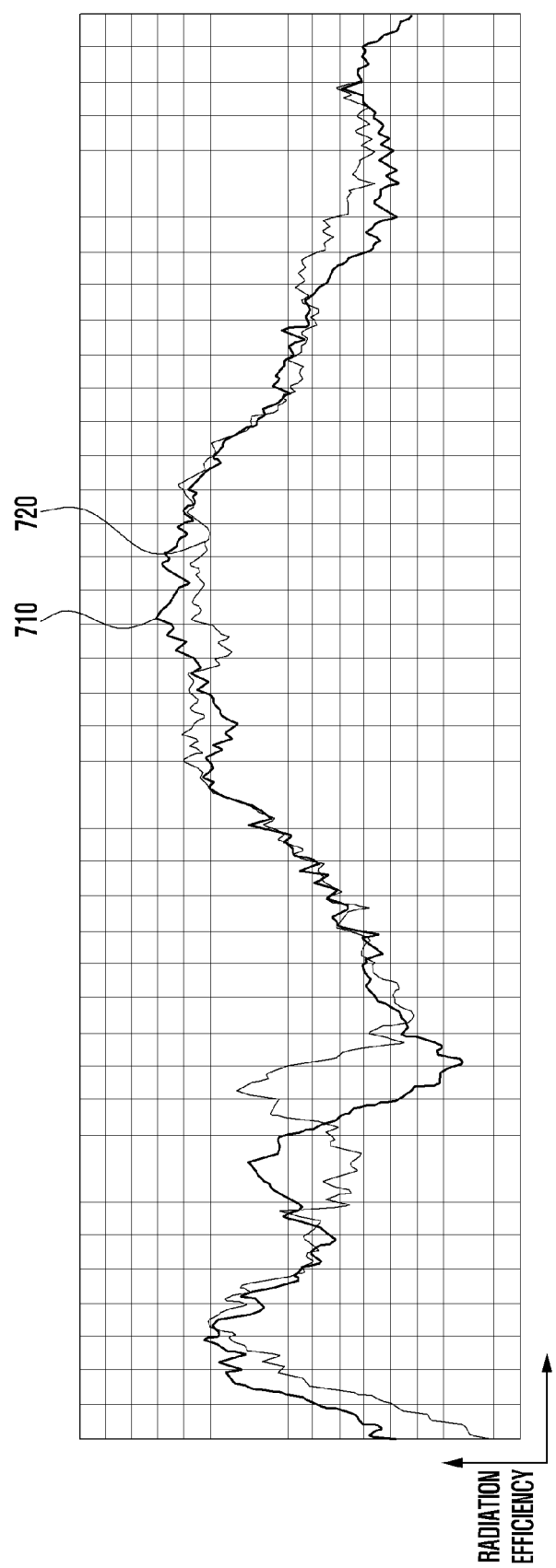
FIG. 7 is a graph illustrating measuring antenna efficiency of a conventional electronic device having a metal case having an exposed external cut portion and of an electronic device according to an embodiment of the present invention.

FIG. 7 illustrates a graph obtained by measuring antenna efficiency of a conventional electronic device having a metal case having an exposed external cut portion and of an electronic device according to an embodiment of the present invention.

Referring to FIG. 7, a first graph 710 illustrates measured radiation efficiency of a conventional electronic device having a metal case having an externally exposed cut portion according to the related art. A second graph 720 illustrates radiation efficiency of an electronic device of which a cut portion is not exposed to the outside according to an embodiment of the present invention. As can be seen, the radiation efficiency of the antenna of the electronic device according to the embodiment of the present invention is equivalent (similar) to the radiation efficiency of the antenna of the electronic device according to the related art.

However, because a cut portion of the electronic device according to the related art is exposed to the outside, performance of an antenna is significantly decreased by a contact of a human body. On the other hand, because a cut portion according to the embodiment of the present invention is not exposed to the outside, a decrease in performance of an antenna due to human contact is prevented.

As described above, in the embodiments of the present invention, because the cut portion of the metal is not exposed to the outside, the user cannot recognize a location of the antenna. Further, because a cut portion according to the embodiment of the present invention is not exposed to the outside, a decrease in performance of an antenna due to a human body can be prevented. In addition, because the cut portion is not exposed to the outside, an antenna can be freely designed without being influenced by the design of the electronic device. In addition, the divided metals may be utilized as a configuration of a function key, a grip sensor, NFC, or wireless charging.

Although the case including a metal and the electronic device including the same according to embodiments of the present invention have been described through the present specification and accompanying drawings by using the specific terms, the terms are merely used as general meanings to easily describe various embodiments of the present invention and assist understanding of the present invention, and the present invention is not limited to the above embodiments. That is, it is obvious to those skilled in the art to which the present invention belongs that various embodiments can be implemented based on the technical idea of the present invention. It will be understood by those skilled in the art that various changes and modifications may be made without departing from the spirit and scope of the invention as defined in the following claims and their equivalents.

What is claimed is:

1. An electronic device comprising:
a case comprising an injection-molded part including a plurality of holes, and a metal part formed under the injection-molded part, the metal part being partially exposed through the plurality of holes,
wherein the metal part is divided into a plurality of parts via a cut portion formed in a portion of the metal part not exposed through the plurality of holes, and
wherein at least one of the plurality of the divided metal parts is utilized as a component element related to a specific function of the electronic device.

2. The electronic device of claim 1, wherein the metal part comprises:
a plate portion located at a lower end of the injection-molded part, which is not exposed through the plurality of holes; and
a protrusion portion protruding from the plate portion, which is exposed through the plurality of holes.

3. The electronic device of claim 1, wherein the metal part is formed in at least one of a convexo-concave pattern and a meandering pattern.

4. The electronic device of claim 1, wherein the case is assembled on at least one of a front surface, a rear surface, and a side surface of the electronic device.

5. The electronic device of claim 1, wherein the component element comprises one of an antenna, a function key, a grip sensor, and a component element for Near Field Communication (NFC) or wireless charging.

6. A case of an electronic device, the case comprising:
an injection-molded part including a plurality of holes; and
a metal part located under the injection-molded part and partially exposed through the plurality of holes.

7. The case of claim 6, wherein the metal part is divided into a plurality of parts.

8. The case of claim 7, wherein at least one of the plurality of the divided metal parts is used as a component element related to a specific function of the electronic device.

9. The case of claim 6, wherein the metal part comprises:
a plate portion located at a lower end of the injection-molded part, which is not exposed through the plurality of holes; and
a protrusion portion protruding from the plate portion, which is exposed through the plurality of holes.

10. The case of claim 6, wherein the metal part is formed in at least one of a convexo-concave pattern and a meandering pattern.

11. The case of claim 6, wherein the component element comprises one of an antenna, a function key, a grip sensor, and a component element for Near Field Communication (NFC) or wireless charging.

* * * * *